(12) United States Patent
Argyres

(10) Patent No.: US 6,964,028 B2
(45) Date of Patent: Nov. 8, 2005

(54) METHOD OF SIMULTANEOUSLY DISPLAYING SCHEMATIC AND TIMING DATA

(75) Inventor: Dimitri Argyres, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 230 days.

(21) Appl. No.: 10/431,383

(22) Filed: May 8, 2003

(65) Prior Publication Data

US 2003/0200519 A1    Oct. 23, 2003

Related U.S. Application Data

(62) Division of application No. 09/921,847, filed on Aug. 3, 2001, now Pat. No. 6,564,365.

(51) Int. Cl.[7] ............................. G06F 9/45; G06F 17/50
(52) U.S. Cl. ............................................ 716/6; 716/11
(58) Field of Search ............ 716/6, 1–5, 11; 703/14–16

(56) References Cited

U.S. PATENT DOCUMENTS

| | | | |
|---|---|---|---|
| 4,855,726 A * | 8/1989 | Nishio .......................... 345/440 |
| 5,568,397 A * | 10/1996 | Yamashita et al. ............. 716/11 |
| 6,442,741 B1 * | 8/2002 | Schultz ........................... 716/6 |
| 6,564,365 B1 * | 5/2003 | Argyres ......................... 716/11 |
| 6,587,999 B1 * | 7/2003 | Chen et al. ..................... 716/6 |
| 6,701,505 B1 * | 3/2004 | Srinivasan .................... 716/10 |

\* cited by examiner

*Primary Examiner*—Vuthe Siek
*Assistant Examiner*—Magid Y. Dimyan

(57) ABSTRACT

A method, and a corresponding data structure, are used for designing a circuit by displaying signal information on a schematic diagram of the circuit to aid in resolving design problems. A circuit design is stored as data in a computer memory. An E-CAD tool software application is performed on the design to create an archive file containing x-y display coordinates for displaying the signals as part of a schematic. The archive file contains names and locations of all signals. The design is analyzed to extract signal information. Timing information may be extracted using a timing analyzer. The information is stored in a data file, such as a timing data file in the computer memory. Timing information and signal display coordinate information may be combined into a new archive file that is used to create a schematic diagram of the circuit, or a portion of the circuit, in which the timing information is displayed near the signals and signal names. Based on the displayed timing information, the designer can identify and attempt to resolve problem signals in the design.

20 Claims, 5 Drawing Sheets

490

| Signal Name | Rise Max-time (picoseconds) | Fall Max-Time (picoseconds) |
|---|---|---|
| A | 472 | 458 |
| B | 503 | 477 |
| C | 497 | 491 |
| D | 570 | 572 |
| E | 700 | 709 |
| F | 694 | 716 |
| G | 472 | 452 |
| H | 497 | 491 |
| I | 613 | 598 |
| J | 662 | 645 |
| K | 472 | 458 |
| L | 599 | 647 |
| M | 790 | 749 |
| N | 780 | 760 |
| O | 738 | 744 |
| P | 385 | 433 |
| Q | 806 | 821 |
| R | 871 | 869 |

METHOD OF SIMULTANEOUSLY DISPLAYING SCHEMATIC AND TIMING DATA

CROSS REFERENCE TO RELATED APPLICATION(S)

This application is a divisional of U.S. patent application Ser. No. 09/921,847, now U.S. Pat. No. 6,564,365, entitled "Method of Simultaneously Displaying Schematic and Timing Data," filed on Aug. 3, 2001, the subject matter of which is hereby incorporated by reference in its entirety.

TECHNICAL FIELD

The technical field relates generally to integrated circuit design. More particularly, the technical field relates to the display of circuit information in a schematic format.

BACKGROUND

In the field of integrated circuit (IC) design and particularly very large scale integration (VLSI) design, circuits are stored as data in a computer memory and manipulated or tested using an electronic computer-aided design (E-CAD) software tool. As used herein, E-CAD tool is meant in the broadest sense and refers to any application for analyzing a circuit design. It may include one or more separate applications for analyzing specific aspects of the design. The memory may store an archive file containing display information for the circuit. Based on this information, the E-CAD tool may create a visual display of the circuit, or a portion of the circuit, in a schematic format.

A circuit may contain multiple elements, such as logic gates and state elements, as well as connections between the elements. Each signal carried between elements may be individually named for analysis. The netlist may be a data file that stores signal names along with the connection information. Methods are known for displaying the signal names on the schematic display by retrieving this information from the netlist. This may be performed, for example, using a schematic drawing application, which may be part of the E-CAD tool or may be a separate application.

In circuit design, substantial time is often required to resolve timing problems for the signals. This is particularly the case in long timing paths found in VLSI designs. For example, a circuit design specification may have minimum and maximum times (min-time, max-time) for signals to travel from one state element, such as a latch, to another state element. If the path timing breaks the min-time specification, it may "race" through the next state element by arriving before a clock that controls the next state element. If the path timing breaks the max-time specification, it may arrive at the next state element during an incorrect clock state. For this reason and others, it is desirable to know the timing for each signal in a circuit or portion thereof.

Timing information is typically retrieved using a timing analyzer software application. The timing analyzer may be part of the E-CAD tool, or it may be a separate application. The timing analyzer is run on each path in the circuit, or portion thereof under test, to identify paths that do not comply with the specification. Once a slow or fast path is identified, the designer may examine each of the signals in the path to identify the problem signal(s). The designer then attempts to resolve the problems in the identified paths by changing gates or by completely redesigning the logic. The timing analyzer is then re-run on the redesigned circuit. In order to resolve a design violation, the designer may have to slow down or speed up certain paths by slowing down or speeding up certain signals. Because some signals may pass to other parts of the design, other than the problematic path under test, the process of changing signal speeds in a design can become difficult. Existing timing analyzers produce a list of timing information for all signals under test or a list of problem paths comprising one or more signals. This is cumbersome to analyze because the designer must correlate this raw data with the raw connection data from the netlist, or with a schematic diagram produced from the netlist, in order to analyze timing problems. This is particularly difficult when the designer attempts to change the timing of signals. What is needed is a more convenient way of displaying timing and other circuit information to assist a designer in resolving problems in circuit paths.

SUMMARY

A method is disclosed for designing a circuit by displaying signal information on a schematic diagram of the circuit to aid in resolving design problems. A circuit design is stored as data in a computer memory. An E-CAD tool software application is performed on the design to create an archive file containing x-y display coordinates for displaying the signals as part of a schematic. The archive file contains names and locations of all signals. The design is analyzed to extract signal information. For example timing information may be extracted using a timing analyzer. The information is stored in a data file, such as a timing data file in the computer memory. Timing information and signal display coordinate information may be combined into a new archive file that is used to create a schematic diagram of the circuit, or a portion of the circuit, in which the timing information is displayed near the signals and signal names. Based on the displayed timing information, the designer can identify and attempt to resolve problem signals in the design. The process can then be repeated by re-running the analysis tool on the modified design to determine whether the design meets specifications.

Also disclosed is a data structure, stored on a computer-readable medium, for designing an integrated circuit. The data structure includes an integrated circuit design, a signals nomenclature data file comprising names of signals in the integrated circuit design, a signals coordinate data file comprising coordinates for displaying the signal names on a schematic of the integrated circuit, and a timing data file comprising timing information about the timing of the signals.

Finally, what is disclosed is method of designing an integrated circuit that includes the steps of storing display coordinate information for signals from the integrated circuit, analyzing timing of the signals, where timing information is generated, storing the timing information, where the timing information for each signal is associated with display coordinate information for each of the signals, displaying the timing information for the signals on a schematic diagram proximate the respective signals, and using the timing information displayed on the schematic diagram to identify a problem with the design.

DETAILED DESCRIPTION

Figure 1:
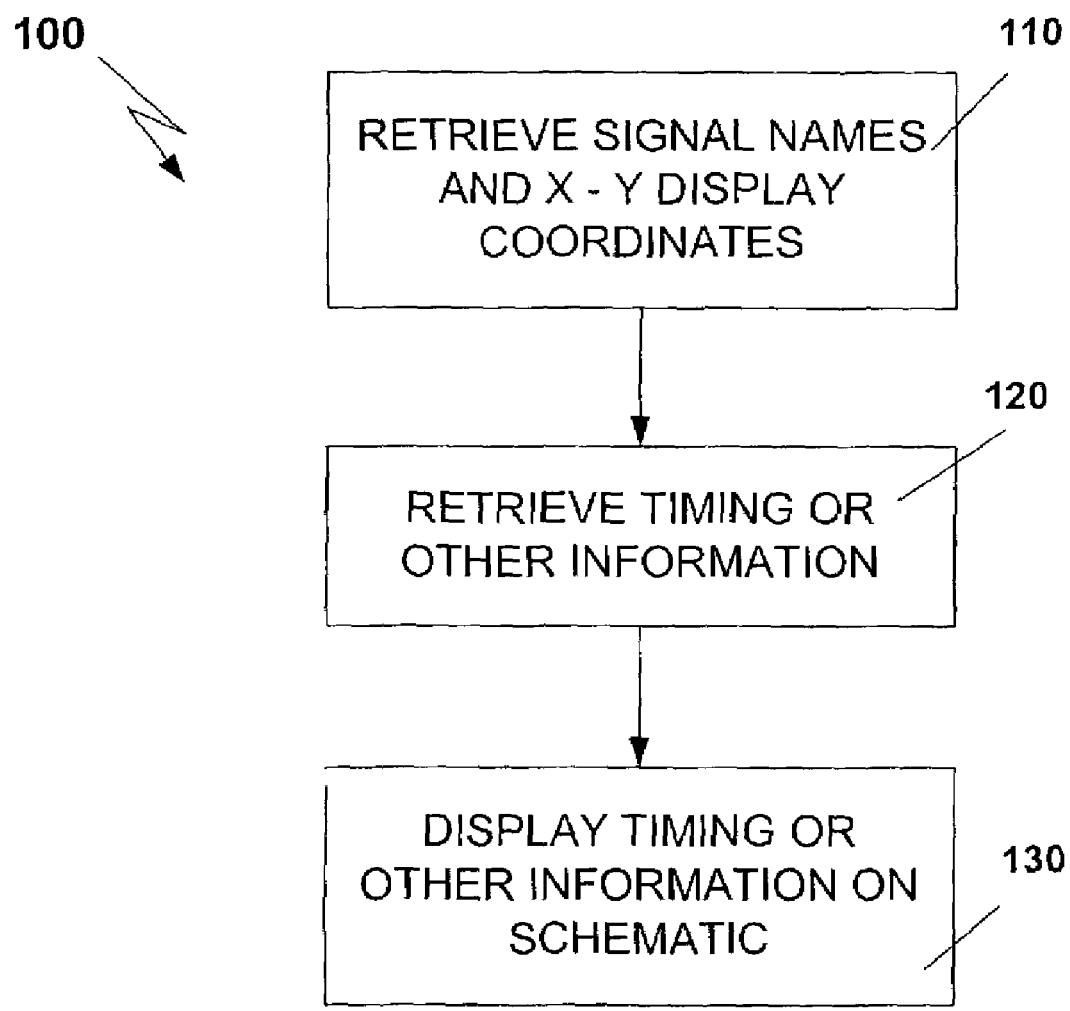
FIG. 1 shows a flow chart of the method.

FIG. 1 shows a flow chart of the method 100. The method 100 uses information about paths and signals in a circuit design, which is stored as data in a computer memory (not shown). The circuit may include state elements, such as latches, and combinatorial elements, such as logic gates. As used herein, "state element" refers to any circuit element capable of storing data over multiple clock cycles. "Combinatorial element" refers to any circuit element that is not a state element. A "path" refers to any connection between state elements, regardless of whether that connection is direct or through one or more other elements. A path also refers to inputs to and outputs from state elements, such as those that may connect to other portions of the circuit design, and to any other inputs or outputs having a known timing. A "signal" refers to any connection between elements, either combinatorial or state elements.

The circuit design information includes nodal connections, signal names, and x-y coordinates of each gate and signal in the schematic. The nodal information indicates which circuit elements are connected. Each signal may be referred to by a particular name. As used herein, a "name" or "signal name" refers to any identifier for a signal in a circuit design. The design information also includes x-y coordinates that are used to display the circuit, or portion thereof, as a schematic. The signal names may also be displayed on the schematic. The x-y coordinates indicate a display position for the circuit elements and for the signal names. As used herein, "x-y coordinate" refers to any information used to identify a display position related to a signal in a schematic diagram. In one embodiment, the x-y coordinates are the display positions of the signal names. Certain design information may be stored in an archive file that is used to create a schematic and in a netlist that contains logical connection information. As used herein, an archive file includes any data file, or collection of files, that stores a signal name and an x-y coordinate used to display the signal name. The archive file may be the complete circuit design stored in the computer memory or it may be a separate file that contains only selected information about the circuit. In one embodiment, the archive file is a separate file from a circuit design that stores various other information about the circuit. In another embodiment, the circuit design comprises multiple data files, including the archive file.

The method 100 retrieves 110 signal names and corresponding x-y coordinates from the archive file. In one embodiment, the method may be performed on a selected portion of the design, in which case only those signals in that portion might be retrieved. The method also retrieves 120 timing information or other information about properties of the signals. Timing information for the signals (or other signal information) is retrieved 120 using a timing analyzer software application that is run on the portion of the design under test. The timing analyzer may be a part of the E-CAD tool, or it may be a separate software application. Timing information includes any information related to timing of the signal and includes, for example, rise and fall times, max-times, and min-times. Other signal information that may be displayed includes, for example, node capacitance, a maximum or minimum number of gates from a latch, simulation values (of a switch simulator, for example), or any other information for which visual coordination with a schematic may be useful. The circuit is then displayed 130 as a schematic using the x-y coordinates from the archive file. The signal names are displayed along with the timing information, or other signal information, for each signal. The schematic may be created using an E-CAD tool or a separate circuit drawing application.

Figure 2:
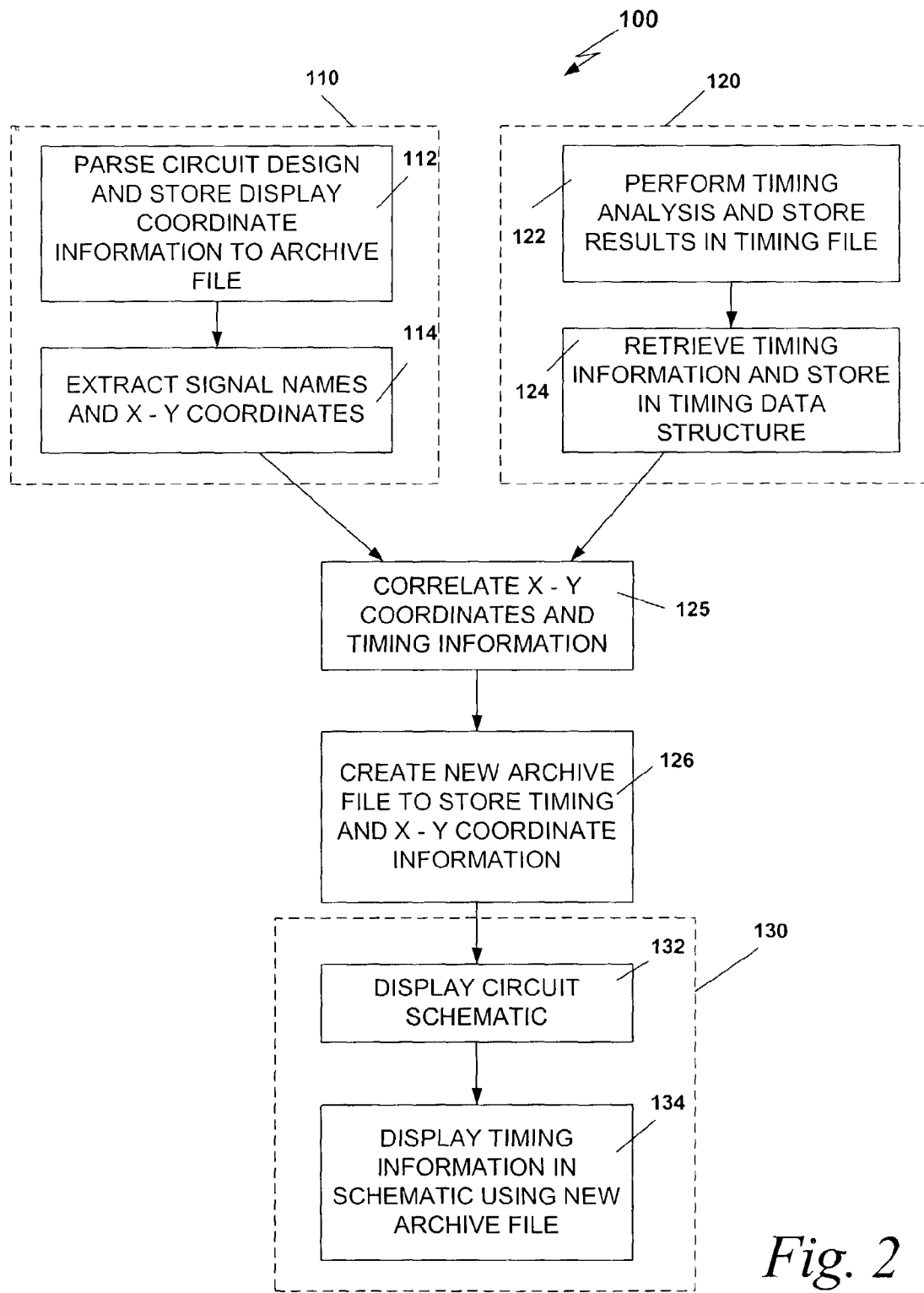
FIG. 2 shows a more detailed flow chart of the method shown in FIG. 1.

FIG. 2 shows a more detailed flow chart of one embodiment of the method 100 shown in FIG. 1. In the example of FIG. 2, signal names and x-y coordinates are retrieved 110 by parsing 112 the circuit design and extracting 114 signal names and x-y coordinates from the design. The circuit design is parsed 112 to create a netlist having connectivity information and an archive file that stores display coordinate information. Signal names and their respective x-y coordinates are extracted 114 from the archive file. Timing or other information is retrieved 120 by performing 122 an analysis on the circuit and retrieving 124 information from that analysis. In the embodiment of FIG. 2, a timing analysis is performed 122 on the paths in the design using a timing analyzer tool. The timing analyzer tool has an output file containing timing information for the signals under test. The timing information is retrieved 124 from the output of the timing analyzer and the timing information is stored in a timing data file. As used herein, the timing data file or database refers to any data structure that holds timing information. In the example of FIG. 2, the steps of retrieving signal names and coordinates 110 and of retrieving timing or other display information 120 are shown as parallel processes, indicating that they may occur simultaneously, or in any other order relative to each other.

After the x-y coordinates and timing or other information has been received, the method 100 correlates 125 the x-y coordinates and the timing information using the signal names. The timing data file has, for example, signal names and corresponding timing information. The archive file has signal names and x-y coordinates. The signal names are used to correlate 125 the two sources of information, and a new archive file is created 126 having signal names, x-y coordinates, and timing or other signal information. In one embodiment, the signal information is displayed 130 using the new archive file by displaying 132 the circuit schematic and then displaying 134 timing or other information using the new archive file. Using the timing information, the designer can quickly and easily trace through problem paths to identify problem signals. The design can then be reconfigured to resolve problem paths, and the whole process repeats.

In one embodiment, the signal names are displayed using existing methods and the timing information is displayed separately by "backgrounding" the timing information, or laying it over the top of the signal name information. The timing information is a collection of notes positioned at various x-y locations corresponding to the positions of the signals displayed. In another embodiment, the entire schematic is generated in a single step using only the new archive file. In still another embodiment, the existing archive file is used, and timing information is appended to it, without creating a new archive file.

A circuit design may include buses having multiple bits, but represented as a single wire in a circuit schematic. In these cases, the worst-case timing or other information may be displayed on the single wire. One method of extracting the worst-case information from a timing file is to identify buses in the timing file, which may be listed, for example, in brackets such as A[5:0] indicating the signal A is a 6-bit bus. The worst-case timing information may be extracted from the timing file. The base name of the signal, A, is then used to search the archive file to identify the x-y coordinates.

Figure 3:
FIG. 3 shows a partial data file of example timing information extracted by the method.
Figure 4:
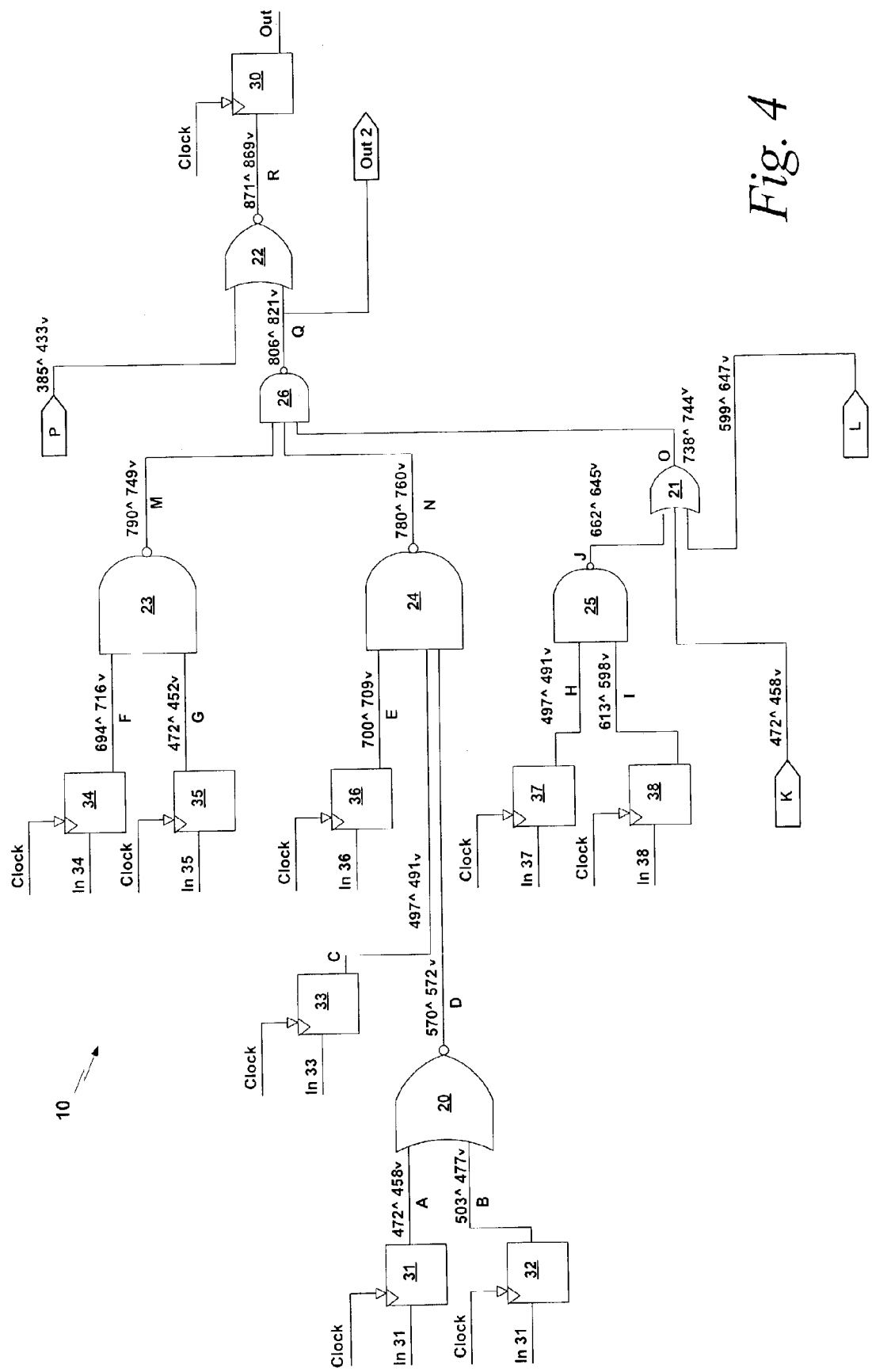
FIG. 4 shows a schematic diagram of a circuit on which the method has been performed.

FIG. 3 shows an example of data in the timing database 490 created by the timing analyzer. In the example of FIG. 3, the database 490 is shown in a table format having max-times for rise and fall times of named signals. One skilled in the art will recognize that the timing data file 490 may include various other timing information as desired, and may be stored in any convenient format FIG. 4 shows a schematic diagram of a portion of a circuit 10 on which the method has been performed. The diagram shows various paths through logic gates 20–26 from state devices 31–38 to another state device 30. Each of the state devices 30–38 has a clock input and may be, for example, latches 30–38. Each latch 30–38 may receive the same clock or different clocks. Each latch 30–38 also has an input, for example, In 31 is the input to latch 31, that is received from another portion of the circuit 10. The portion of the circuit 10 shown in FIG. 3 may be referred to as a logic cone, in that several paths come together through combinatorial logic elements 20–26. A path is defined by various signals leading from one state element to another. For example, the path between latch 31 and latch 30 comprises signals A, D, N, Q, and R. The path between latch 34 and latch 30 comprises signals F, M, Q, and R. The path between latch 38 and latch 30 comprises signals I, J, O, Q, and R. Also shown in FIG. 4 are three input signals K, L, P, which may come, for example, from state elements in another part of the circuit either on the same chip or on another chip. FIG. 4 also shows an output Out2 carrying the Q signal to another portion of the circuit design.

Each path may have a specification for a min-time and a max-time. A timing analysis tool analyzes the circuit and determines whether the design meets specification. In one embodiment, those paths that do not meet specification are then analyzed by a timing analyzer to extract timing information for each of the signals that comprises the path. The schematic is created using existing methods that include the signal names on each of the signal. Each signal name has a particular x-y coordinate associated with it to allow the design to be displayed as a schematic with the signal names shown in the correct locations. The timing information for each of the signals is displayed next to, or on top of, the signal names so that a designer can trace through the logic cone and instantly determine the timing information for each signal. In one embodiment, various colors may be used to display the timing or other signal information to distinguish it, for example from the signal name or circuit elements.

In the example of FIG. 4, the timing information includes a rise time and a fall time for each signal. The times are shown in picoseconds. For each signal, the rise time is shown first, followed by a "^" and the fall time is shown second followed by a "v" indicator. For example, the timing information for signal D is 570^582v, indicating that the rise time is shown 570 picoseconds and the fall time is 582 picoseconds. The timing information and notation in FIG. 4 is shown by way of example, and various other conventions may be used to display various information about the signals. In the example of FIG. 4, the rise times and fall times show aggregate times for including all signals upstream of a particular signal, such that the times of the signals output of combinatorial elements are always at least as large as the largest input signal time.

Although not shown in either of FIG. 3 or 4, the inputs, In1, etc. and outputs, Out2, etc. will also have timing information that may be stored in the timing file shown in FIG. 3 and may be displayed on the schematic diagram shown in FIG. 4.

Figure 5:
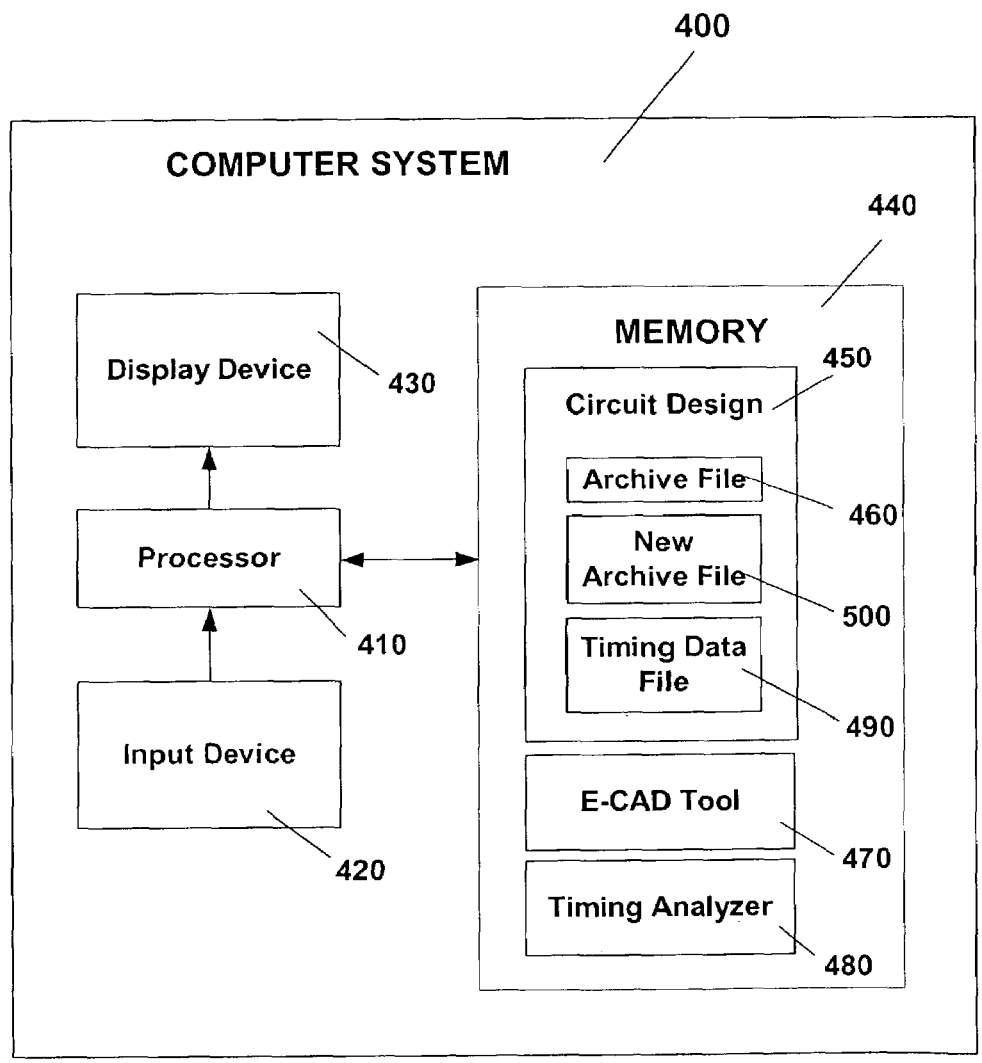
FIG. 5 shows a block diagram of a computer system that uses the method.

FIG. 5 shows a block diagram of a computer system 400 having a processor 410 connected to an input device 420 and a display device 430. The processor 410 accesses memory 440 in the computer system 400 that stores a VLSI circuit design 450. The design 450 may be a single database or may reside in various other data forms, such as a plurality of files. Part or all of the design 450 may be a archive file 460, or archive file 460. The archive file 460 includes display coordinate information about the design, including the signal names and x-y coordinates for those signal names. An E-CAD tool 470 is also stored in the memory 440 for analyzing the circuit model 450. In use, the input device 420 receives commands instructing the processor 410 to call the E-CAD tool software 470 to perform a circuit analysis on the model 450. The results of the analysis may be displayed on the display device 430. A timing analyzer 480 may also be stored in memory 440. The timing analyzer 480 is a software timing application that analyzes the timing of signals in the circuit design 450, including the rise and fall times of the signals. In one embodiment, the timing analyzer 480 creates a timing data file 490, which may be stored in a computer memory 440 as well. The timing data file 490 includes information about the rise and fall times of the signals in the circuit design 450. In one embodiment, the method creates a new archive file 500, which may also be stored in memory 440. The new archive file 500 includes the signal names, x-y coordinates, and timing information for the circuit. Using the x-y coordinates, the processor 410 causes the timing information to be displayed on the display device 430. The timing information may be displayed over the top of the signal names, for example, by centering the timing information on the x-y coordinates for each respective signal name. In still another embodiment, the timing information may be displayed based on an offset of the x-y coordinates such that the timing information is displayed next to the signal names.

Although the present invention has been described with respect to particular embodiments thereof, variations are possible. The present invention may be embodied in specific forms without departing from the essential spirit or attributes thereof. In addition, although aspects of an implementation consistent with the present invention are described as being stored in memory, one skilled in the art will appreciate that these aspects can also be stored on or read from other types of computer program products or computer-readable media, such as secondary storage devices, including hard disks, floppy disks, or CD-ROM; a carrier wave from the Internet or other network; or other forms of RAM or read-only memory (ROM). It is desired that the embodiments described herein be considered in all respects illustrative and not restrictive and that reference be made to the appended claims and their equivalents for determining the scope of the invention.

What is claimed is:

1. A method of designing a circuit comprising:
   running an E-CAD tool on a circuit design stored in a computer memory to identify names of signals in the design and coordinates for displaying the signal names on a circuit schematic;
   storing display coordinate information for the signals in an archive file;
   analyzing timing of the signals;
   storing timing information about the timing of the signals in a timing data file;

storing the timing information and the display coordinate information in a single data file, wherein the timing information for each signal is associated with display coordinate information for each of the signals;

displaying the timing information for the signals on a schematic diagram proximate the respective signals; and using the timing information displayed on the schematic diagram to identify a problem with the design.

2. The method of claim 1, wherein the step of analyzing timing comprises using a timing analyzer software application.

3. The method of claim 1, wherein the step of storing timing information comprises storing a rise time and a fall time for the signals.

4. The method of claim 1, wherein the step of displaying comprises using the coordinates to display the timing information.

5. The method of claim 1, wherein the step of displaying comprises displaying a rise time and a fall time for the signals.

6. The method of claim 1, wherein the step of displaying comprises displaying a min-time and a max-time of the signals.

7. The method of claim 1, wherein the step of displaying timing information comprising displaying worst-case timing information for a bus signal.

8. A data structure stored on a computer-readable medium, the data structure used for designing an integrated circuit comprising:

an integrated circuit design;

a signals nomenclature data file comprising names of signals in the integrated circuit design;

a signals coordinate data file comprising coordinates for displaying the signal names on a schematic of the integrated circuit;

a timing data file comprising timing information about the timing of the signals; and a single data file, wherein the timing information for each signal is associated with display coordinate information for each of the signals, wherein the timing information is displayable on the schematic of the integrated circuit proximate the respective signals.

9. The data structure of claim 8, wherein colors are stored with the timing information, the colors distinguishing the timing information from the signal names.

10. The data structure of claim 8, wherein the timing information comprises a rise time and a fall time for each of the signals.

11. The data structure of claim 8, wherein the coordinates comprise x-y coordinates for each of the signals.

12. The data structure of claim 8, wherein the data structure is stored on a computer hard disk.

13. The data structure of claim 8, wherein the data structure is stored in a removable storage device.

14. The data structure of claim 8, wherein the data structure is carried on a carrier wave over a digital communications network.

15. The data structure of claim 8, wherein the timing information includes max-times and min-times.

16. The data structure of claim 8, further comprising a signal information data file, comprising:

a node capacitor;

a maximum number of gates from a latch;

a minimum number of gates from the latch; and simulation values.

17. A method of designing an integrated circuit, comprising:

storing display coordinate information for signals from the integrated circuit;

analyzing timing of the signals, wherein timing information is generated;

storing the timing information, wherein the timing information for each signal is associated with display coordinate information for each of the signals;

displaying the timing information for the signals on a schematic diagram proximate the respective signals; and using the timing information displayed on the schematic diagram to identify a problem with the design.

18. The method of claim 17, wherein the step of analyzing timing comprises using a timing analyzer software application.

19. The method of claim 17, wherein the step of storing timing information comprises storing a rise time and a fall time for the signals.

20. The method of claim 17, wherein the step of displaying comprises:

using the coordinates to display the timing information;

displaying a rise time and a fall time for the signals;

displaying a min-time and a max-time of the signals; and displaying worst-case timing information for a bus signal.

* * * * *